US009698213B1

United States Patent
Yang

(10) Patent No.: US 9,698,213 B1
(45) Date of Patent: Jul. 4, 2017

(54) VERTICAL MIM CAPACITOR

(71) Applicant: INTERNATIONAL BUSINESS MACHINES CORPORATION, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/278,145

(22) Filed: Sep. 28, 2016

(51) Int. Cl.
*H01L 23/64* (2006.01)
*H01L 49/02* (2006.01)
*H01L 23/522* (2006.01)

(52) U.S. Cl.
CPC .......... *H01L 28/75* (2013.01); *H01L 23/5223* (2013.01); *H01L 28/86* (2013.01)

(58) Field of Classification Search
CPC .................................................. H01L 23/5223
See application file for complete search history.

(56) References Cited

U.S. PATENT DOCUMENTS

| 5,581,436 A * | 12/1996 | Summerfelt | H01L 28/55 257/E21.009 |
| 5,675,184 A | 10/1997 | Matsubayashi et al. | |
| 5,879,985 A | 3/1999 | Gambino et al. | |
| 6,124,164 A * | 9/2000 | Al-Shareef | H01L 28/55 257/E21.009 |
| 6,184,074 B1 * | 2/2001 | Crenshaw | H01L 28/40 257/E21.011 |
| 6,238,961 B1 * | 5/2001 | Asano | H01L 21/76816 257/E21.019 |
| 6,461,914 B1 | 10/2002 | Roberts et al. | |
| 6,624,040 B1 * | 9/2003 | Ng | H01L 21/76811 257/E21.018 |
| 6,670,237 B1 | 12/2003 | Loh et al. | |
| 6,706,588 B1 * | 3/2004 | Ning | H01L 23/5223 257/E21.018 |
| 6,764,915 B2 | 7/2004 | Lee | |
| 6,911,229 B2 | 6/2005 | Andricacos et al. | |
| 8,354,703 B2 * | 1/2013 | Horak | H01L 21/3105 257/306 |
| 8,901,711 B1 * | 12/2014 | Yang | H01L 28/75 257/534 |
| 9,391,015 B2 * | 7/2016 | Jeannot | H01L 23/5223 |
| 2008/0057662 A1 * | 3/2008 | Blalock | H01L 28/65 438/387 |
| 2008/0254204 A1 * | 10/2008 | Stapelmann | H01L 21/28194 427/99.2 |

* cited by examiner

*Primary Examiner* — Benjamin Sandvik
(74) *Attorney, Agent, or Firm* — Cantor Colburn LLP; Louis Percello

(57) ABSTRACT

Vertical metal-insulator-metal (MIM) capacitors include a metal conductor including a sidewall; a high k dielectric layer on the sidewall of the metal conductor; and a vertically oriented metal layer on the high k dielectric layer. Also disclosed are methods for fabricating the vertical MIM capacitor, wherein a single patterning/mask process can used to fabricate the vertical MIM capacitor structure.

14 Claims, 4 Drawing Sheets

US 9,698,213 B1

VERTICAL MIM CAPACITOR

BACKGROUND

The present invention generally relates to semiconductor integrated circuits, and more particularly, to the structure and formation of vertical metal-insulator-metal capacitors in the semiconductor integrated circuits.

Various capacitive structures are used as electronic elements in integrated circuits such as radio frequency integrated circuits (RFIC), and monolithic microwave integrated circuits (MMIC). Such capacitive structures include, for example, metal-oxide-semiconductor (MOS) capacitors, p-n junction capacitors and metal-insulator-metal (MIM) capacitors. A MIM capacitor typically includes an insulating layer, such as a PECVD dielectric, disposed between lower and upper electrodes. MIM capacitors are typically used to store a charge in a variety of semiconductor devices, such as mixed signal and analog products. For some applications, MIM capacitors can provide certain advantages over MOS and p-n junction capacitors because the frequency characteristics of MOS and p-n junction capacitors can be restricted as a result of depletion layers that form in the semiconductor electrodes. Furthermore, MIM capacitors are formed in the metal interconnect layers, thereby reducing CMOS transistor process integration interactions or complications.

SUMMARY

In one or more embodiments, a vertical metal-insulator-metal (MIM) capacitor includes a metal conductor including a vertically oriented sidewall. A high k dielectric layer is on the vertically oriented sidewall of the metal conductor; and a vertically oriented metal layer is on the high k dielectric layer. The metal conductor, the high k dielectric layer on the metal conductor sidewall, and the vertically oriented metal layer on the high k dielectric layer define the vertical MIM capacitor.

In one or more embodiments, a process for forming a vertical metal-insulator-metal capacitor includes providing a semiconductor substrate having a patterned insulator layer including a metal conductor formed in the patterned insulator layer, wherein a top surface of the patterned insulator layer is coplanar to a top surface of the metal conductor. A metal cap layer is selectively deposited onto the top surface of the metal conductor. The patterned insulator layer surrounding the metal conductor is removed. A high k dielectric material is selectively deposited onto a sidewall of the metal conductor. A metal plate layer is conformally deposited onto the semiconductor substrate. A second insulator layer is deposited onto the semiconductor substrate. The semiconductor substrate is planarized to the top surface of the metal conductor, wherein the metal conductor sidewall, the high k dielectric material and the metal plate layer are vertically oriented and define the vertical MIM capacitor.

In one or more embodiments, a process for forming a vertical metal-insulator-metal capacitor includes providing a semiconductor substrate having a patterned insulator layer including a metal conductor formed in the patterned insulator layer, wherein a top surface of the patterned insulator layer is coplanar to a top surface of the metal conductor. A dielectric cap layer is blanket deposited onto the coplanar top surfaces of the metal conductor and the patterned insulator layer. The dielectric cap layer is patterned to expose the top surface of the patterned insulator layer. The exposed patterned insulator layer surrounding the metal conductor is removed. A high k dielectric material is selectively depositing onto a sidewall of the metal conductor. A metal plate layer is conformally deposited onto the semiconductor substrate. A second insulator layer is deposited onto the semiconductor substrate. The semiconductor substrate is planarized to the top surface of the metal conductor, wherein the metal conductor sidewall, the high k dielectric material and the metal plate layer are vertically oriented and define the vertical MIM capacitor.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
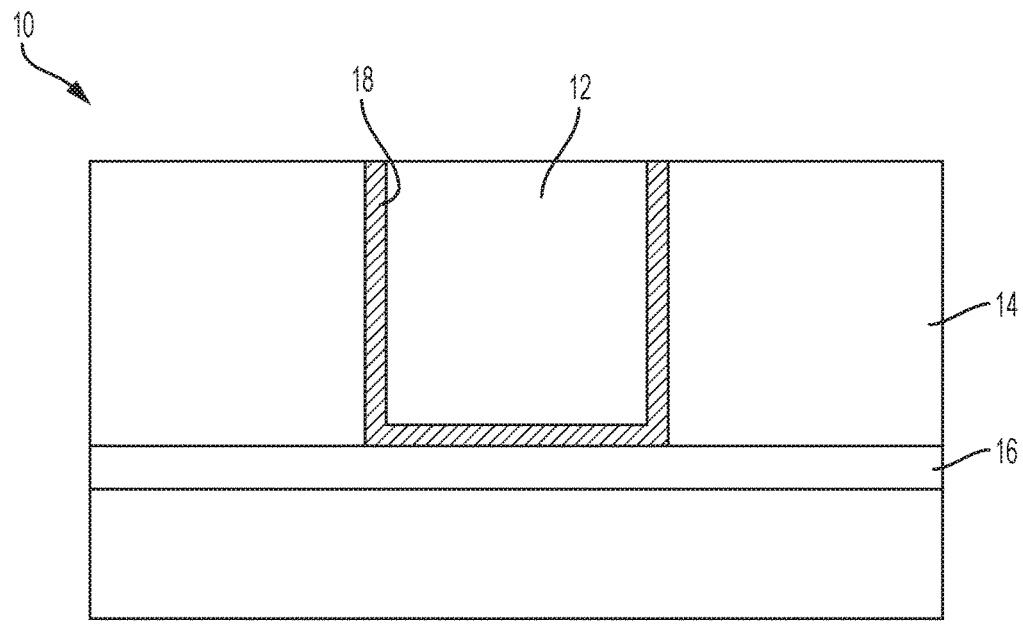
FIG. 1 depicts a schematic cross-sectional view illustrating a semiconductor structure including a metal conductor in an insulating layer subsequent to planarization in accordance with one or more embodiments.

The detailed description explains the embodiments of the invention, together with advantages and features, by way of example with reference to the drawings.

DETAILED DESCRIPTION

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures.

The same numbers in the various figures can refer to the same structural component or part thereof. The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As previously noted herein, the MIM capacitor is one of the most common electrical components used in almost every electrical device. Prior art MIM capacitors are manufactured in the back end of line (BEOL) and are horizontally oriented. Most MIM capacitors are fabricated by forming the bottom capacitive plate in a first or subsequent horizontal metallization layer of a semiconductor wafer. A second mask, pattern and etch step is required to form the top capacitive plate. Alternatively, MIM capacitors are formed between horizontal metallization layers in the BEOL in additional horizontal layers, with each plate requiring a separate pattern and etch level.

One of the problems associated with MIM capacitor fabrication is the high cost given that each plate in the capacitor requires a separate pattern and etch level. Moreover, as devices continue to scale to ever shrinking dimensions, there is a limited area within which to fabricate the MIM capacitor not to mention the accompanying performance issues.

The present invention generally provides semiconductor structures including vertical MIM capacitors, which overcomes some of the problems associated with horizontal MIM capacitors. The vertical MIM capacitor structures and processes generally include a single patterning and mask step to create the structure for the device.

Reference is now made to FIGS. 1-8, which are pictorial representations (through cross sectional views) depicting the basic processing steps and the resulting semiconductor structure employed in one or more embodiments of the present invention. Specifically, the inventive method begins with providing a post planarized semiconductor structure 10 including a metal conductor 12, e.g., a conductive metal line, in a patterned insulator layer 14, which are formed on an underlying cap layer 16 as shown in FIG. 1. A metal liner 18 is intermediate the metal and the insulator layer 14, which can prevent the metal element 12 from diffusing into the insulator layer 14.

As shown, the top surface is substantially planar, which is generally performed to remove any metal overburden that typically results upon deposited of the metal into the patterned insulating layer. For example, the surface can be planarized using an electropolishing process. In an electropolishing process small amounts of metal are etched from the metal by electroetch or electrochemical etching to provide a metal interconnect having a top surface 20 generally coplanar to the top surface of the insulating layer 14. Such a structure is often referred to as a recessed structure. In another embodiment, the planar surface is formed by chemical-mechanical-polishing (CMP), using a non-selective slurry composition. The slurry composition contains a silica abrasive material, which removes the different metal layers at substantially the same rate. Alternatively, a planar surface can be formed by a non-selective plasma etching process. The plasma etching process can include additional planarizing layers deposited onto copper layer. For example, a layer of photoresist can be deposited onto copper layer prior to performing the non-selective etch process.

The metal level 12 is not intended to be limited and can be copper, aluminum, tungsten, ruthenium, iridium, rhodium, cobalt, or mixtures thereof. The metal can be formed by CVD, sputtering, electrochemical deposition or like processes. For example, the deposition of copper can proceed by electrochemical deposition such as electroplating or electroless plating. Examples of suitable copper electroplating compositions are described in U.S. Pat. No. 6,911,229 assigned to International Business Machines Corporation, the entire description of which is incorporated by reference in its entirety.

The metal liner 18 is not intended to be limited and can be titanium, tantalum, tantalum nitride or titanium nitride are often selected as suitable materials for forming the metal liner. The presence of the metal liner insures that the metal, participating in the interdiffusion during subsequent annealing processes, will not further diffuse into underlying dielectric layers.

The insulator layer 14 can be one of a number of different dielectric materials commonly used in integrated circuit fabrication. For example, dielectric layer 14 can be silicon dioxide, silicon nitride, silicon carbide, or a doped glass layer, such as phosphorus silicate glass, boron silicate glass, and the like. In other embodiments, the dielectric layer can be a low k dielectric layer, wherein low k generally refers to materials having a dielectric constant less than silicon dioxide. Exemplary low k dielectric materials include, without limitation, SiLK® from Dow Chemical, Coral® from Novellus, Black Diamond® from Applied Materials, and spin on dielectrics can be used. Coral® can be described generically as a SiCOH dielectric. Depending upon the particular dielectric material, dielectric layer 14 can be formed by chemical vapor deposition deposited (CVD), plasma enhanced chemical vapor deposition (PECVD), atmospheric deposition as well as spin on techniques. In one or more embodiments, dielectric layer 12 is a chemical vapor deposited material, such as silicon dioxide or silicon nitride, which has been deposited over a planarized dielectric layer.

Once the insulator layer 14 has been deposited, openings such as trench and/or via features are photolithographically patterned into the insulator layer 12. Photolithography can include forming a photoresist (not shown) onto at least the dielectric surfaces where openings are desired, exposing the photoresist to a pattern of activating radiation, and then developing the exposed photoresist with a resist developer to provide a patterned photoresist. At least one etch process can be employed to transfer the pattern from the patterned photoresist into the insulator layer 14 and form the opening. The etching process can be a dry etch (e.g., reactive ion etching, plasma etching, ion beam etching, or laser ablation) and/or a wet chemical etch (e.g., potassium hydroxide (KOH)). After transferring the pattern, the patterned photoresist is removed utilizing resist stripping processes, for example, ashing.

Figure 2:
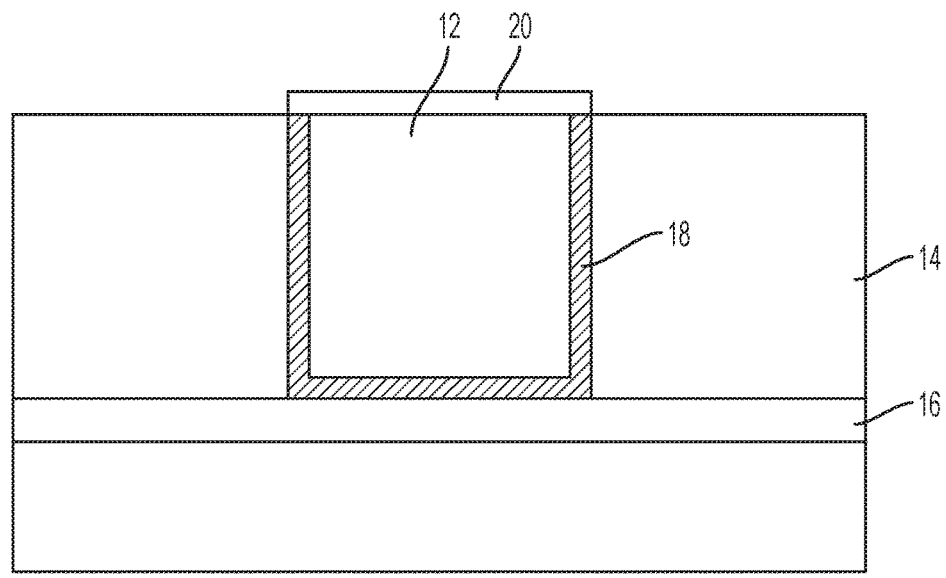
FIG. 2 depicts a schematic cross-sectional view illustrating the semiconductor structure after selective deposition of a cap layer on a top surface of the metal conductor in accordance with one or more embodiments.

In FIG. 2, a capping layer 20 is selectively deposited onto the metal. The cap protects the underlying metal 12 from oxidation, humidity, and contamination during formation of the interconnect structure and/or the next metal level(s) on the semiconductor structure 10. Additionally, capping layer serves to prevent undesirable diffusion of the underlying metal conductor 12 into insulating layer 14.

In one or more embodiments, the capping layer can be a metal such as cobalt, tungsten, ruthenium or the like. The metal capping layer can be selectively deposited using chemical vapor deposition, atomic layer deposition, electroless, or the like.

Optionally, instead of selective deposition, a cap formed of either a dielectric or a metallic material can be first blanket deposited (not shown) onto the planar surface, and then follow with a patterning process to create a structure similar to FIG. 2. Suitable dielectric materials include, but are not limited to, silicon nitride, silicon carbide, silicon oxycarbide, hydrogenated silicon carbide, silicon dioxide, organosilicate glass, Si(N, H) and other low-k dielectrics. Suitable metallic materials include, but are not limited to, Ta, W, Jr, Rh, Co, Ru, Ni, Al, mixtures, thereof, or the like. The thickness of the cap 20 can be between 1 Angstrom and 1000 Angstroms or more. In one or more embodiments, the thickness of the cap is 50 Angstroms to 500 Angstroms, and in still one or more other embodiments, the thickness of the titanium nitride cap layer is 100 to 400 Angstroms.

Figure 3:
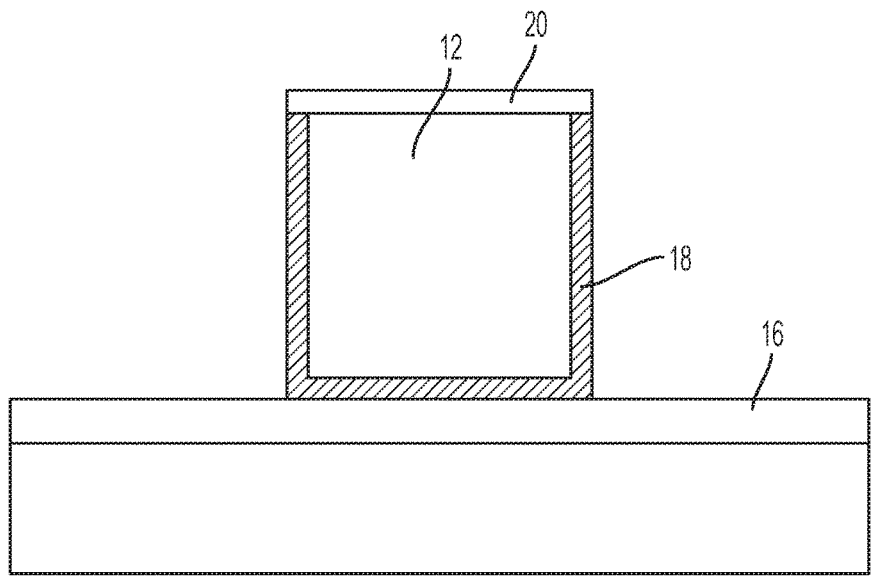
FIG. 3 depicts a schematic cross-sectional view illustrating the semiconductor structure after removal of the insulating layer abutting the metal conductor in accordance with one or more embodiments.

In FIG. 3, the insulating layer 14 is selectively removed to the cap mlayer 16 by a wet etch process. The term "wet etching" generally refers to application of a chemical solution. This can be a time controlled dip in the etch solution. Suitable etch solutions include $HNO_3$, HCL, $H_2SO_4$, HF or combinations thereof. Prior to wet etching, the dielectric material is first damaged such as by a plasma treatment containing $H_2$, He, $N_2$, $NH_3$, $O_2$, or other chemicals. Removal of the dielectric material provides the semiconductor substrate 10 with the metal 12, the cap thereon, and the liner 18 about the sidewalls of the metal.

Figure 4:
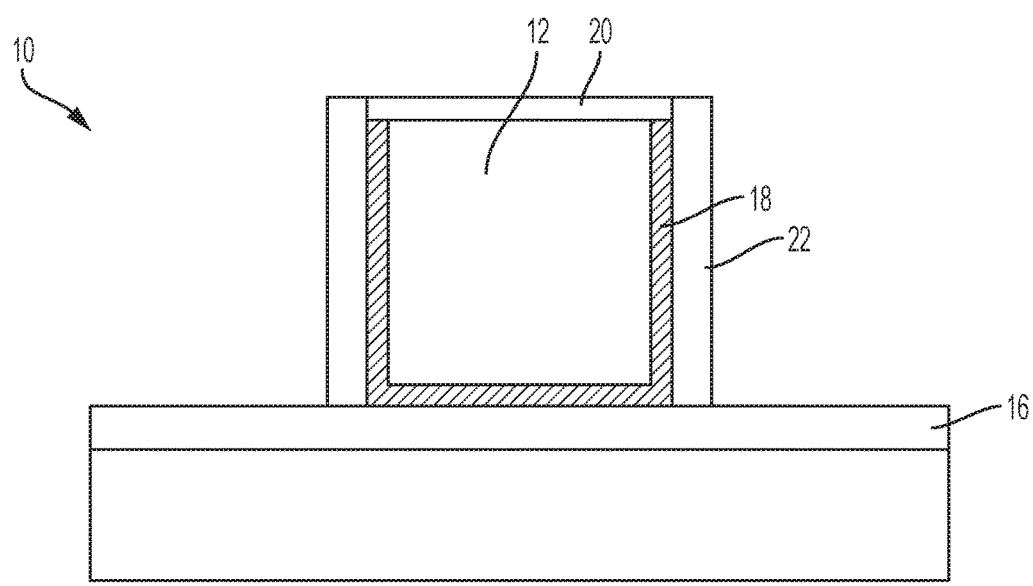
FIG. 4 depicts a schematic cross-sectional view illustrating the semiconductor structure after selective deposition of a high k dielectric on a sidewall of the metal conductor in accordance with one or more embodiments.
Figure 5:
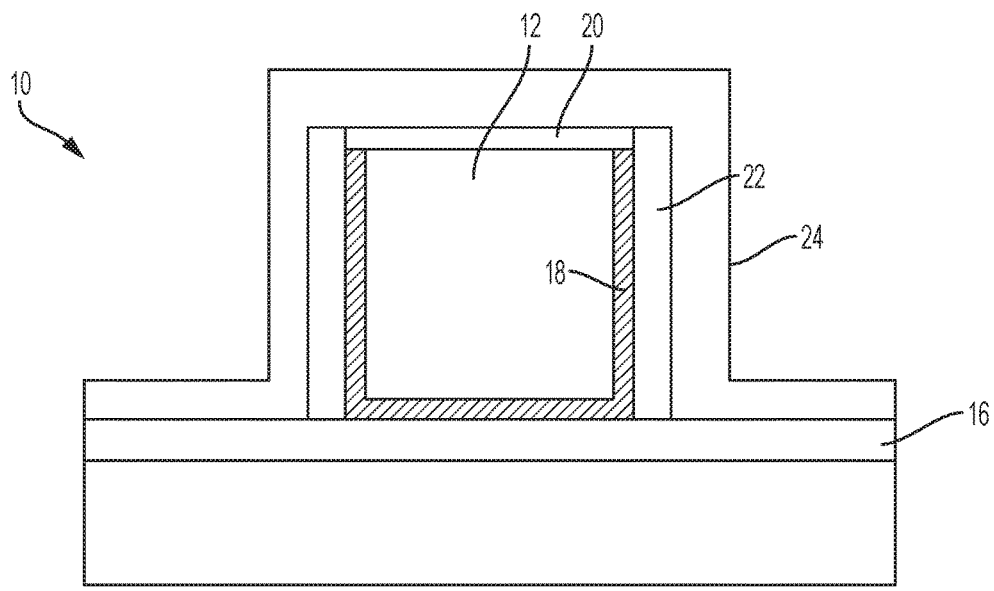
FIG. 5 depicts a schematic cross-sectional view illustrating the semiconductor structure after conformal deposition of a metal plate layer onto the structure in accordance with one or more embodiments.

In FIG. 4, a high k dielectric layer 22 is selectively deposited onto the liner 18. As used herein, the term "high k" generally refers to materials having a dielectric constant greater than silicon dioxide. The high k dielectric is not intended to be limited and can be deposited by chemical vapor deposition, atomic layer deposition or the like.

Exemplary high k dielectric materials include tantalum oxide ($Ta_2O_5$, $TaO_2$), barium strontium titanate (BST), strontium titanate (ST), barium titanate (BT), lead zirconium titanate (PZT), silicon carbide, silicon oxynitride, silicon nitride, zirconium oxide, aluminum oxide, hafnium oxide, strontium bismuth tantalate (SBT) or the like. Such materials effectively possess dielectric constants significantly greater than conventional dielectrics, wherein k equals 3.9 for silicon dioxide, the dielectric constants of these high k materials can range from about 10 to as high as about 800. Using such materials enables the creation of much smaller and simpler capacitor structures for a given stored charge requirement, enabling the packing density dictated by future generation circuit design. By way of example, TaOxNy can be selectively deposited ono the sidewalls of the metal 12 and thermally treated to convert the film to a TaOx high k dielectric material. As will be discussed in greater detail below, any high k dielectric material deposited onto the cap 20 is of no consequence as it will later be removed. The thickness can range from between 1 Angstrom and 1000 Angstroms or more. In one or more embodiments, the thickness of the high k dielectric material is 10 Angstroms to 500 Angstroms, and in still one or more other embodiments, the thickness of the high k layer is 50 to 100 Angstroms Referring now to FIG. 5, a conformal metal plate layer 24 is then deposited onto the substrate 10. The conformal metal plate layer 24 can be deposited by plasma vapor deposition, chemical vapor deposition, atomic layer deposition, or the like. Suitable metals for forming the metal layer include, without limitation, copper, tungsten, aluminum, tantalum, titanium, cobalt, ruthenium, nitrides thereof, alloys thereof, combinations thereof, or the like. The thickness of the conformal metal layer is not intended to be limited and is generally between 100 Angstroms and 5000 Angstroms. A patterning process can be followed to define area and structure of the capacitor element (not shown).

Figure 6:
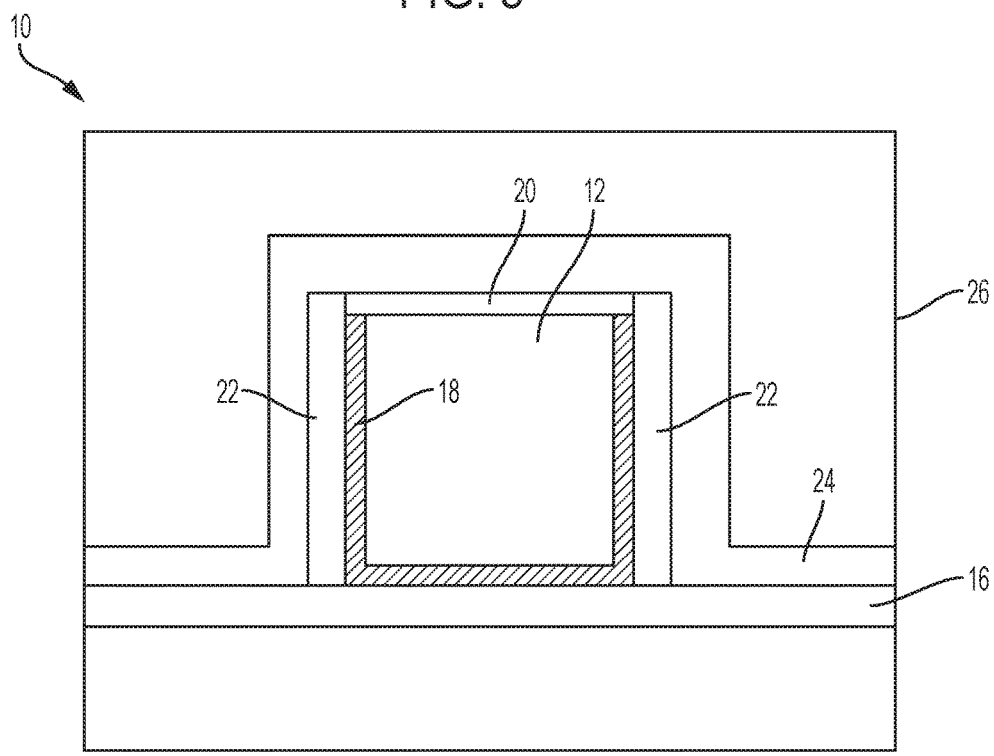
FIG. 6 depicts a schematic cross-sectional view illustrating the semiconductor structure after interlayer dielectric deposition onto the structure in accordance with one or more embodiments.

In FIG. 6, an intermetal dielectric layer 26, also referred to as an interlayer dielectric layer, is deposited onto the substrate 10. The dielectric layer, 26 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by plasma enhanced chemical vapor deposition procedures as is generally known in the art. The thickness of the dielectric layer 26 generally ranges from 50 nm to 5000 nm, although lesser and greater thicknesses can also be employed.

Figure 7:
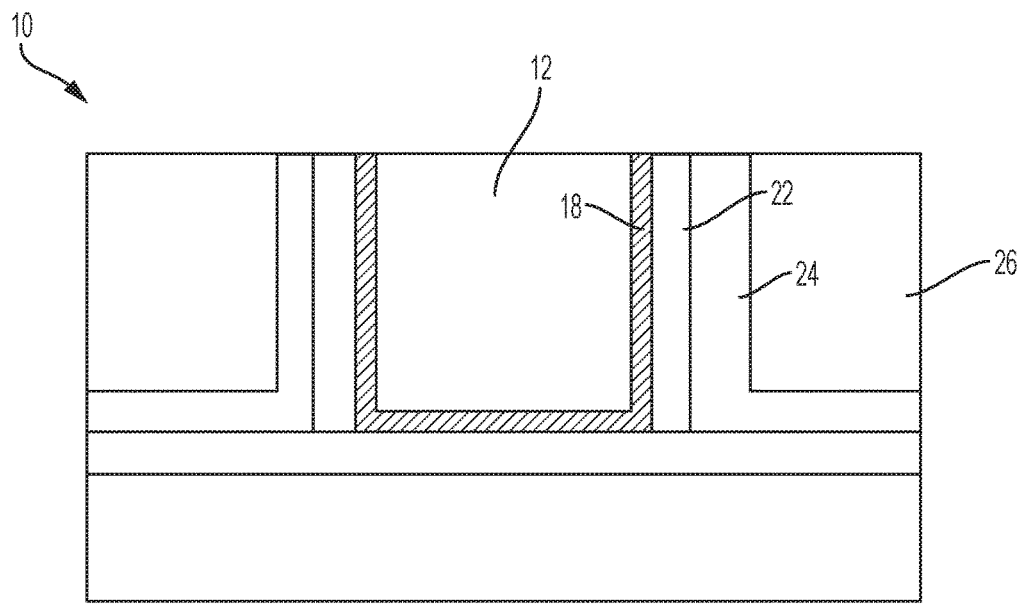
FIG. 7 depicts a schematic cross-sectional view illustrating the semiconductor structure after planarization to the metal conductor, thereby defining the vertical MIM capacitor in accordance with one or more embodiments.

IN FIG. 7, the substrate 10 is subjected to a planarization process such as electropolishing, chemical mechanical polishing or the like. The planarization process is to the top surface of the metal 12 and defines the vertical MIM capacitor structure, which generally includes trench sidewall of the metal and metal liner 12, 18, the high k dielectric 22, and the patterned metal 24.

Figure 8:
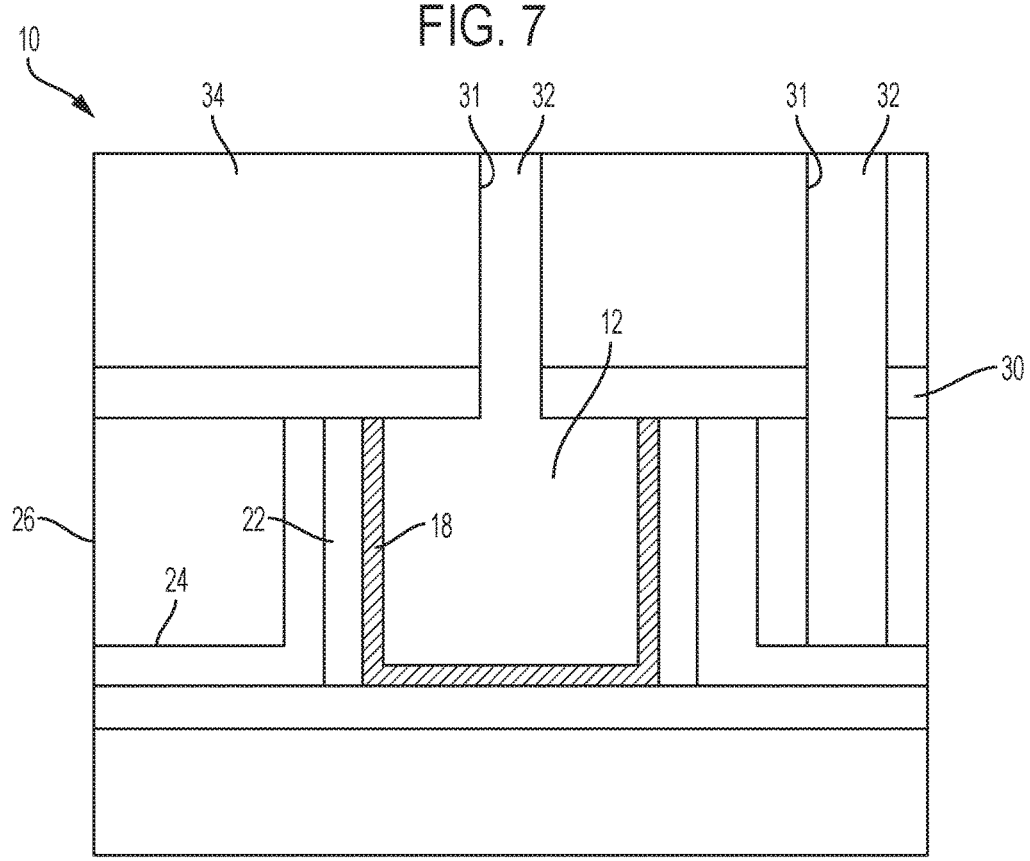
FIG. 8 depicts a schematic cross-sectional view illustrating the semiconductor structure including the vertical MIM capacitor after interconnection of the metal conductor with an interconnect structure in accordance with one or more embodiments.

In FIG. 8, interconnection of the metal level, i.e., conductor, with an interconnect structure is made. A capping layer 30 is formed on the planar surface of the substrate 10 and the interconnect structure to the metal conductor 12 can be formed. The capping layer 30 protects the underlying metal conductive line 112 from oxidation, humidity, and contamination during formation of the interconnect structure and the next metal level(s) on the semiconductor substrate 10. Additionally, capping layer 30 serves to prevent undesirable diffusion of the underlying conductor 12 into interlayer 34. Capping layer 30 can be made of any suitable capping material such as silicon nitride, silicon carbide, silicon oxycarbide, hydrogenated silicon carbide, silicon dioxide, organosilicate glass, and other low-k dielectrics.

The process for forming the interconnect structures generally begins with formation of an interlayer dielectric 34 onto the capping layer 30, wherein formation of the interlayer 34 includes deposition of one or more dielectric layers.

The interlayer dielectric 34 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by PECVD, spin-on or other procedures as is generally known in the art.

The process then includes patterning the interlayer 34 using standard lithography and etching techniques. The lithographic step generally includes applying a photoresist to the surface of the dielectric layer, exposing the photoresist to a desired pattern of radiation, and developing the exposed resist utilizing a photoresist developer to form a pattern. The etching process can be a dry etching or wet etching process. The capping layer 30 at the bottom of the via 31 is also selectively removed, thereby exposing the metal conductive line 12 as well as the metal layer 24.

A plasma treatment can then be performed to clean the exposed the surface of the metal conductive line 12 at the bottom of the via 31 of contaminants, oxides, nitrides, or the like. The plasma cleaning step can include exposing a process gas including $H_2$, He, forming gas, $O_2$ or combinations thereof and a carrier gas. The carrier gases can include inert gases such as He, Ne, Ar, Kr, Xe and Rn, and combinations thereof. The process conditions can include a temperature of between about room temperature and about 450° C., a pressure of between about 0.5 mtorr and about 100 torr, an ion current density generally less than 50 $\mu A/cm^2$, and a process time of between about 5 seconds and about 600 seconds. In one or more embodiments, the ion current density is about 5 to about 20 $\mu A/cm^2$. The cleaning step can be repeated multiple times as desired.

Metallization of the via 31 is completed by deposition of a metal liner layer onto the substrate followed by metal filling 32 and chemical mechanical planarization so as to form the semiconductor structure as is generally shown in FIG. 8.

The metal liner layer can be deposited onto the exposed dielectric surfaces by a deposition process such as, for example, PVD, atomic layer deposition (ALD), chemical vapor deposition (CVD), plasma enhanced chemical vapor deposition (PECVD), sputtering, chemical solution deposition, or plating. The thickness of metal liner layer generally ranges from 0.5 Angstroms to 250 Angstroms. The resulting metal liner layer serves as a barrier to prevent the subsequently deposited metal conductive interconnect material from diffusing through to the dielectric layer 34.

The metal lined via features are then filled with a conductive metal such as copper to form the interconnect structure 32. Filling the pattern with a copper metal can include first depositing a copper seed layer. The copper seed layer can be also deposited by sputtering. The seed layer would typically be about 50 to 400 Å thick. The function of the seed layer is to provide a base onto which a main conductor layer can be deposited. The seed layer can be deposited by atomic layer deposition (ALD), sputter deposition, plasma vapor deposition (PVD), chemical vapor deposition (CVD) or the like.

Suitable seed layers are generally chosen to provide improved electromigration resistance, improved adhesion to the underlying liner layer, and improved surface properties suitable for deposition of the main conductor copper body. Exemplary copper alloys that have been shown to improve the electromigration resistance relative to pure copper, include Cu (Sn), Cu (In), Cu (zr), Cu (Ti) and Cu (C, N, O, Cl, S). Exemplary seed layers that improve the adhesion properties relative to pure copper which include Cu (Al), Cu (Mg), and alloys of Cu with other reactive metals such as Be, Ca, Sr, Ba, Sc, Y, La, and rare earth series elements of Ce, Pr, Nd, Sm, Eu, Gd, Tb, Dy, Ho, Er, Tm, Yb and Lu, and Hf, V, Mb, Ta, Cr, Mo, W, Mn, Re, Si and Ge. The seed layer can include additional alloying elements that improve surface properties for the seed layer such as B, O, N, P, Fe, Ru, Os, Co, Rh, Ir, Ni, Pd, Pt, Ag, Au, Zn and Cd. Uniformity of seed layer is typically desired, because a poor seed layer can result in voids. It is also desirable to ensure that the seed layer surface is free of oxides for efficient charge transfer during plating.

On top of seed layer, a conductive metal layer (e.g., a copper conductor) is deposited. The conductive metal layer can be deposited onto the surface by an electrochemical deposition process. Other processes such as e-beam evaporative deposition, physical vapor deposition, or CVD, can be used to deposit the metal layer. The conductive metal fills the via trench features. In addition, a metal overburden layer is formed over the top surfaces of the dielectric layer, which is also referred to as the overburden. Exemplary conductive metals suitable for the interconnect structure includes low resistivity materials such as copper, aluminum, tungsten, cobalt, ruthenium, iridium, rhodium, mixtures thereof and the like.

In one or more embodiments, the substrate is then subjected to an annealing process, which improves various properties of the metal conductor such as providing an increased grain size so as to increase conductivity, reducing stress, and reducing electromigration. The annealing process generally includes heating the substrate at an elevated temperature typically less than 400° C. in an inert atmosphere for a defined period of time of about sixty minutes or less. Ovens, furnaces, rapid thermal processing equipment and the like can be utilized for the annealing process.

After annealing, a chemical mechanical polishing (CMP) process is then utilized to remove the overburden and portions of the liner layer 124 formed at the top surface of the dielectric layer 34, i.e., removes material from the field area. The CMP process planarizes the surface of the interconnect structure by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry. The trench feature in the resulting interconnect structure includes a liner layer formed within the dielectric layer, the seed layer, and the metal conductor. Optionally, the CMP process can occur prior to the annealing process.

It should be apparent that the resulting vertical MIM capacitor structure is located within one patterned feature and includes two vertical electrodes and an insulator therebetween. One of the electrodes contains two different metallic layers, e.g., the metal conductor and metal liner whereas the other electrode contains a single metallic layer. The process is compatible with current BEOL process flows.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A method for forming a vertical metal-insulator-metal capacitor, the method comprising:
    providing a semiconductor substrate comprising a patterned insulator layer including a metal conductor formed in the patterned insulator layer, wherein a top surface of the patterned insulator layer is coplanar to a top surface of the metal conductor;
    selectively depositing a metal cap layer onto the top surface of the metal conductor;
    removing the patterned insulator layer surrounding the metal conductor;
    selectively depositing a high k dielectric material onto a sidewall of the metal conductor;
    conformally depositing a metal plate layer onto the semiconductor substrate;
    depositing a second insulator layer onto the semiconductor substrate;
    planarizing the semiconductor substrate to the top surface of the metal conductor, wherein the metal conductor sidewall and the high k dielectric material are vertically oriented, and the metal plate layer includes vertically oriented and horizontally oriented portions;
    forming a capping layer on the planar surface of the semiconductor substrate;
    forming an interlayer dielectric onto the capping layer;
    filling a first via to the metal conductor with a metal, wherein the metal conductor defines a first electrode;
    forming filling a second via to a horizontal oriented portion of the metal plate with a metal, wherein the metal plate defines a second electrode.

2. The method of claim 1 further comprising forming an upper level interconnect and creating electrical contacts to both the metal conductor and the metal cap layer.

3. The method of claim 1, wherein removing the patterned insulator layer surrounding the metal conductor comprises a wet etch process.

4. The method of claim 1, wherein the selectively depositing the metal cap layer onto the top surface of the metal conductor comprises chemical vapor deposition or atomic layer deposition.

5. The method of claim 1, wherein the high k dielectric comprises tantalum oxide, barium strontium titanate, strontium titanate, barium titanate, lead zirconium titanate, silicon carbide, silicon oxynitride, silicon nitride, zirconium oxide, aluminum oxide, hafnium oxide, or strontium bismuth tantalate.

6. The method of claim 1, wherein the metal conductor and the metal plate layer are different metals.

7. The method of claim 1, wherein the metal conductor comprises a metal and a metal liner layer, and the metal plate layer is a single metallic layer.

8. The method of claim 1, wherein the metal conductor comprises copper, aluminum, tungsten, ruthenium, iridium, rhodium, cobalt, or mixtures thereof.

9. A method for forming a vertical metal-insulator-metal capacitor, the method comprising:
    providing a semiconductor substrate comprising a patterned insulator layer including a metal conductor formed in the patterned insulator layer, wherein a top surface of the patterned insulator layer is coplanar to a top surface of the metal conductor;
    blanket depositing a dielectric cap layer onto coplanar top surfaces of the metal conductor and the patterned insulator layer;
    patterning the dielectric cap layer to expose the top surface of the patterned insulator layer;
    removing the exposed patterned insulator layer surrounding the metal conductor;
    selectively depositing a high k dielectric material onto a sidewall of the metal conductor;
    conformally depositing a metal plate layer onto the semiconductor substrate;
    depositing a second insulator layer onto the semiconductor substrate;
    planarizing the semiconductor substrate to the top surface of the metal conductor, wherein the metal conductor sidewall, the high k dielectric material and the metal plate layer are vertically oriented and define the vertical MIM capacitor.

10. The method of claim 9 further comprising forming an upper level interconnect and creating electrical contacts to the metal conductor.

11. The method of claim 9, wherein the high k dielectric comprises tantalum oxide, barium strontium titanate, strontium titanate, barium titanate, lead zirconium titanate, silicon carbide, silicon oxynitride, silicon nitride, zirconium oxide, aluminum oxide, hafnium oxide, or strontium bismuth tantalate.

12. The method of claim 9, wherein the metal conductor and the metal plate layer are different materials.

13. The method of claim 9, wherein the metal conductor comprises a metal and a metal liner layer, and the metal plate layer is a single metallic layer.

14. The method of claim 9, wherein the metal conductor comprises copper, aluminum, tungsten, ruthenium, iridium, rhodium, cobalt, or mixtures thereof.

* * * * *